United States Patent
Landru et al.

(10) Patent No.: US 7,892,951 B2
(45) Date of Patent: Feb. 22, 2011

(54) SOI SUBSTRATES WITH A FINE BURIED INSULATING LAYER

(75) Inventors: Didier Landru, Champ Pres Froges (FR); Sébastien Kerdiles, Saint Ismier (FR)

(73) Assignee: S.O.I.Tec Silicon on Insulator Technologies, Bernin (FR)

( * ) Notice: Subject to any disclaimer, the term of this patent is extended or adjusted under 35 U.S.C. 154(b) by 94 days.

(21) Appl. No.: 12/237,000

(22) Filed: Sep. 24, 2008

(65) Prior Publication Data
US 2009/0111243 A1 Apr. 30, 2009

(30) Foreign Application Priority Data
Oct. 26, 2007 (FR) .................................. 07 07535

(51) Int. Cl.
  H01L 21/20 (2006.01)
  H01L 21/46 (2006.01)
  H01L 21/568 (2006.01)
  H01L 21/569 (2006.01)
  H01L 21/57 (2006.01)

(52) U.S. Cl. .................. 438/480; 438/455; 438/459

(58) Field of Classification Search ................ 438/480, 438/455, 459
See application file for complete search history.

(56) References Cited

U.S. PATENT DOCUMENTS

| | | | |
|---|---|---|---|
| 6,180,496 B1 | 1/2001 | Farrens et al. | 438/455 |
| 6,902,987 B1 | 6/2005 | Tong et al. | 438/455 |
| 7,575,988 B2 * | 8/2009 | Bourdelle et al. | 438/518 |
| 2003/0134486 A1 | 7/2003 | Wang | 438/455 |
| 2003/0138997 A1 | 7/2003 | Wang | 438/151 |
| 2003/0211705 A1 | 11/2003 | Tong et al. | 438/455 |
| 2004/0150006 A1 * | 8/2004 | Aulnette et al. | 257/200 |
| 2004/0152282 A1 | 8/2004 | Tong et al. | 438/455 |
| 2004/0159946 A1 | 8/2004 | Moxham et al. | 257/738 |
| 2004/0178449 A1 | 9/2004 | Wang | 257/347 |
| 2005/0067377 A1 | 3/2005 | Lei et al. | 216/33 |
| 2005/0079712 A1 | 4/2005 | Tong et al. | 438/689 |
| 2005/0196937 A1 | 9/2005 | Daval et al. | 438/455 |
| 2006/0046488 A1 | 3/2006 | Lei et al. | 438/689 |

(Continued)

FOREIGN PATENT DOCUMENTS

EP 1858 071 A1 11/2007

(Continued)

OTHER PUBLICATIONS

Singapore Application No. 200807231-6 Search Report Mailed Feb. 15, 2010.

(Continued)

*Primary Examiner*—Luan C Thai
(74) *Attorney, Agent, or Firm*—Winston & Strawn LLP

(57) ABSTRACT

A method of producing a semiconductor structure having a buried insulating layer having a thickness between 2 and 25 nm, by: forming at least one insulating layer on a surface of a first or second substrate, or both, wherein the surfaces are free from an insulator or presenting a native oxide layer resulting from exposure of the substrates to ambient conditions; assembling the first and second substrates; and thinning down the first substrate, in order to obtain the semiconductor structure. In this method, the insulating layer forming stage is a plasma activation based on an oxidizing or nitriding gas.

20 Claims, 5 Drawing Sheets

U.S. PATENT DOCUMENTS

| | | | |
|---|---|---|---|
| 2006/0049399 A1 | 3/2006 | Lei et al. | 257/40 |
| 2006/0110899 A1 | 5/2006 | Bourdelle et al. | 438/584 |
| 2007/0202635 A1* | 8/2007 | Ellis-Monaghan et al. | 438/149 |
| 2007/0284660 A1 | 12/2007 | Deguet et al. | 257/347 |
| 2008/0268615 A1* | 10/2008 | Allibert et al. | 438/455 |

FOREIGN PATENT DOCUMENTS

| | | |
|---|---|---|
| EP | 1 659 623 B1 | 4/2008 |
| WO | WO 01/61743 A1 | 8/2001 |
| WO | WO 2004/100268 | 11/2004 |
| WO | WO 2006/090201 | 8/2006 |

OTHER PUBLICATIONS

French Search Report Appln. No. FR 0707534.

Jean-Pierre Colinge, "Silicon-On-Insulator Technology: Materials to VLSI", 2nd Edition pp. 50-51.

T. Suni et al, "Effects of plasma activation on hydrophilic bonding of Si and $SiO_2$", Journal of the Electrochemical Society, vol. 149, No. 6, p. G348-G351 (2002).

R, H. Esser et al., "Improved Low-Temperature Si-Si Hydrophilic Wafer Bonding", Journal 0/ The Electrochemical Society, vol. 150 (3) G228-G231 (2003).

Sheri N. Farrens, "Chemical Free Room Temperature Wafer To Wafer Direct Bonding", Journal of the Electrochemical Society, vol. 142, No. 11, p. 3949-3955 (1995).

U. Gösele et al., "Wafer Bonding For Microsystems Technologies", Sensors and Actuators vol. 74, pp. 161-168 (1999).

* cited by examiner

SOI SUBSTRATES WITH A FINE BURIED INSULATING LAYER

TECHNICAL FIELD OF THE INVENTION

The present invention relates to a method of producing substrates by means of the direct wafer bonding of two substrates made from materials chosen from among semiconductor materials, the final structure thereby obtained being intended, in particular, for applications in the fields of electronics, optics, photovoltaics or optoelectronics.

To be more precise, this final structure is a Semiconductor On Insulator (SeOI), more particularly an SOI (Silicon On Insulator) substrate, characterized by an extremely thin (i.e., below 50 nm), buried insulator. In the event that the thin insulator should be an oxide, the substrate is said to be of an UTBOX (ultra-thin buried oxide) type. This final structure is achieved by direct wafer bonding a so-called "donor" substrate to a so-called "receiver" substrate, then thinning down the donor substrate with a view to transferring a generally thin layer of material from said donor substrate to the receiver substrate.

BACKGROUND ART

Direct wafer bonding is a technique that enables two substrates with perfectly flat surfaces to be directly adhered to one another without the use of adhesives (paste, glue, etc.). This type of bonding is a technological step commonly used in the production of SOI and SeOI structures.

There are three basic methods of producing SeOI or SOI structures by direct bonding: the Smart Cut™ method, Bonded Silicon On Insulator (BSOI) or Bonded and Etchback Silicon On Insulator (BESOI) methods, and the ELTRAN® method. A description of the procedures involved in each of these methods can be found in the publication "Silicon wafer bonding technology for VLSI and MEMS applications", S. S. Lyer and A. J. Auberton-Hervé, IEE (2002) and they are also well known to skilled artisans.

The SOI substrates obtained by direct wafer bonding according to these different methods include a buried insulating layer. Consequently, in order to create an insulating layer of silicon oxide ($SiO_2$) on the original silicon substrate or substrates, thermal treatment can be applied in order to achieve wet or dry thermal oxidation of the silicon in the substrate surface. Alternatively, common depositing techniques such as CVD (Chemical Vapor Deposition), LPCVD (Low Pressure Chemical Vapour Deposition) and PCVD (Plasma Chemical Vapour Deposition) can also be used.

The thickness of the thermal or deposited oxide layers varies depending on the final structure required, in other words, depending on the thickness of the buried insulating layer sought. In order to produce UTBOX substrates, the buried insulating layer has a thickness under 50 nm, preferably between 5 nm and 25 nm.

However, the thinness of the insulating layer of the UTBOX substrates makes molecular bonding difficult and indirectly affects the quality of the final substrate. Based on a constant production method, an SOI substrate characterized by a so-called thick buried insulator (typically having a thickness of over 100 nm) statistically exhibits far fewer bonding defects, as revealed following low-level thermal treatment, than a substrate with a very thin buried insulator.

In fact, with UTBOX structures, the species present at bonding interface level, such as water, hydrogen, hydrocarbons or species resulting from an implantation stage, can no longer find sufficient trapping sites within the thin oxide layer and diffuse along the bonding interface where they coalesce, giving rise to numerous structural defects.

In the case of a thin layer transfer using Smart Cut™ technology, the main defects exacerbated on the final structures by the extreme thinness of the buried insulator are referred to as "blisters" and "non-transferred zones". As is shown in FIG. 1, they lead to holes of different sizes in the active layer 10, but these are always "killer" defects for the device produced from these substrates.

The non-transferred zones 200, known by the abbreviation "NTZ" or else referred to as "voids", are holes in the active layer 10 and the buried insulator 3 of a size typically between 0.1 µm and 3 mm. An NTZ 200 corresponds to a zone in an active layer 10 resulting from a donor substrate 1, also referred to as the first substrate, which is not transferred to the receiver substrate 2, also referred to as the second substrate. When these NTZs are localized on the periphery of the final structure, more precisely at a distance typically between 1 and 5 mm from the edge of the substrate, they are referred to as edge voids 300.

An edge void 300 is a hole with a diameter typically between 50 µm and 3 mm in the thin transferred layer 10.

A blister 400 corresponds to a zone of transferred film that is removed from the receiver substrate 2 under pressure from an accumulated gas bubble at the bonding interface. Since the film that is lifted locally is very fragile, a blister 400 invariably leads to a hole in the final structure, with a diameter typically between 0.5 and 3 mm.

All holes in the centre or on the edge of the wafer, whether microscopic or macroscopic in size, are killer defects, because in the absence of an active layer for the creation of electronic components, no component can be produced on this site. A greater number of NTZs 200, edge voids 300 and blisters 400 are therefore synonymous with a decline in quality and a drop in yield.

In order to reduce the number of defects associated with the bonding stage and reinforce the bonding interface, the substrates may undergo plasma activation before they are brought into contact. "Plasma activation" of a bonding surface is defined as the exposure of this surface to plasma (which, notably, may take place in a vacuum or at atmospheric pressure).

More precisely, in the known activation techniques, the surface of a section to be activated is exposed to plasma at an exposure stage in which the exposure parameters are controlled, so that each one is set at a given value that remains fixed throughout the plasma activation.

The principle "exposure parameters" are:
power density. This is the power density supplied to the plasma, which translates a power density by unit area ($W/cm^2$) and will likewise be referred to in this text simply using the term "power".
pressure (pressure in the vessel holding the plasma),
the nature and output of the gas supplying this vessel, and
the activation duration.

Activation of this type makes it possible, in particular, to execute direct wafer bonding by achieving significant bonding energies without having to resort to thermal treatment which must, necessarily, be carried out at high temperatures.

In effect, plasma activation makes it possible to obtain high bonding energies between two substrates, at least one of which has been activated prior to bonding, following thermal treatment carried out for relatively short durations (around 2 hours, for example) and at relatively low temperatures (around 600° C. or less, for example).

Activation of this type is therefore advantageous in stabilizing a structure comprising two bonded substrates, if the intention is to avoid subjecting the structure to excessively high temperatures (particularly in the case of heterostructures, which are defined as structures made up of layers of materials with significantly different thermal expansion coefficients).

Activation of this type may also be advantageous in achieving significant bonding strengths at a given temperature.

Activation of this type is therefore advantageous, for example, in achieving multilayer structures involving the bonding of two substrates.

The transfer procedures (particularly Smart Cut™ procedures for which a general description is given in the publication SILICON-ON-INSULATOR TECHNOLOGY: Materials to VLSI, $2^{nd}$ Edition (Jean-Pierre COLINGE), or BESOI (Bond Etch Silicon On Insulator) procedures, in which two substrates are bonded then the surplus material is removed from one of the substrates by etching, or the ELTRAN™ procedure) are examples of applications that can benefit from plasma activation to support bonding.

In order to benefit fully from the effects of plasma treatment for each bonding, the standard procedure found in the literature (notably in the documents entitled *Effects of plasma activation on hydrophilic bonding of Si and SiO$_2$*, T. Suni and l. J. Electroch. Soc. Vol. 149, n° 6, p. 348 (2002) and in the U.S. Pat. No. 6,180,496 by Farrens et al.) involves the plasma activation of one or both bonding substrates.

Different gases are used today in plasma treatments, in order to activate the wafer surfaces before they are brought into contact, including, for instance, oxygen, nitrogen and argon. However, although the various techniques currently used favour a high bonding energy at the interfaces, they do not allow very high quality semiconductor structures to be produced with thin or even ultra-thin insulating layers. Thus, improvements in these techniques are needed.

SUMMARY OF THE INVENTION

The invention now produces an SeOI semiconductor structure with a high-quality thin buried insulating layer, presenting a thickness between 2 and 25 nm, and the lowest possible defectivity, thanks in particular to the provision of a reinforced bonding interface.

The invention provides a simplified and less onerous method of producing SeOI structures with a thin buried insulating layer. The insulator for burying is traditionally obtained by thermal oxidation or deposition, a stage that is itself preceded by wet cleaning. The invention enables these stages to be eliminated by forming the insulator with the aid of plasma treatment, which simplifies the procedure, removes the costs associated with cleaning and forming the insulator and reduces the thermal budget. The elimination of a cleaning stage makes it possible to avoid any increased roughness associated with this stage and therefore to improve the quality of the subsequent bonding.

The sharp reduction in the thermal budget associated with the elimination of the insulator depositing or thermal treatment stage (e.g., thermal oxidation of the silicon) forming the insulator makes it possible to limit the number of defects produced at temperatures higher than 600° C., such as dislocations or other defects associated with thermal treatment, such as slip lines or also oxide precipitates that can appear within the substrates treated.

In accordance with the invention, improvements in the production of a semiconductor structure having a buried insulating layer of a thickness of between 2 and 25 nm, are obtained by: forming at least one insulating layer on a surface of a first or second substrate, or on both substrates, with the surface(s) receiving the insulating layer initially being free of any insulator other than the presence of a native oxide layer resulting from exposure of the substrate(s) to ambient conditions, and with the insulating layer being formed by plasma activation based on an oxidizing or nitriding gas; assembling the first and second substrates together; and thinning the first substrate in order to obtain the semiconductor structure.

To be more precise, an advantageous application of the invention involves the production of SeOI substrates characterized by a thin buried insulator, more especially UTBOX (Ultra-Thin Buried Oxide) SOI substrates with a thickness of under 25 nanometers, and particularly at around ten or so nanometers, for example.

This method of producing SeOI structures may be used with a view to transferring a thin layer by direct wafer bonding with a thinning-off of the substrate (using, e.g., a Smart Cut™ transfer or other method).

BRIEF DESCRIPTION OF THE FIGURES

Other features and advantages of the invention will emerge from the description of it given below, with reference to the attached drawings that represent several possible embodiments, these being given by way of example without being in any way restrictive. In these drawings:

FIGS. 2A to 2E are diagrams representing successive stages in a first embodiment of the inventive procedure;

Figure 1:
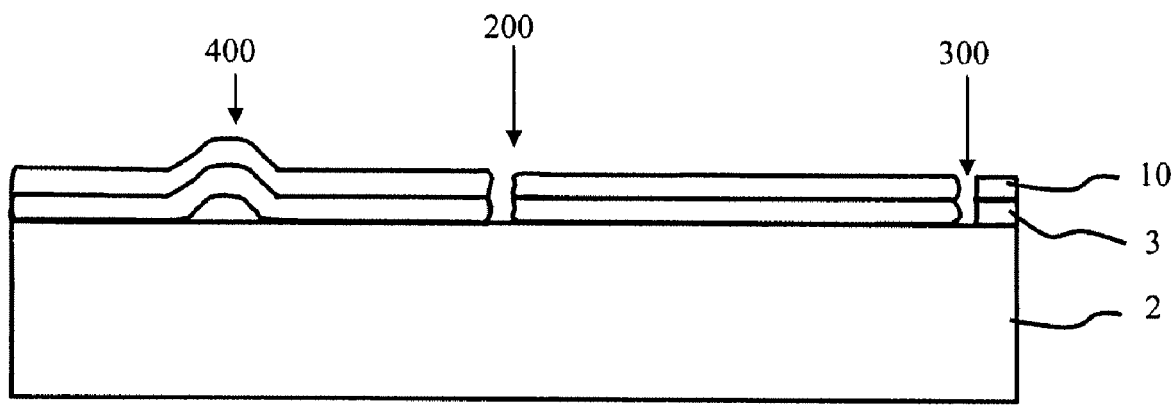
FIG. 1 is a diagram representing different defects that may be present in a conventional SeOI substrate.

Identical, similar or equivalent sections of the various figures described below have the same numerical references, making it possible to move from one figure to the next.

DETAILED DESCRIPTION OF THE PREFERRED EMBODIMENTS

There now follows a brief description of the different successive stages in a first embodiment. FIG. 2A represents a first semiconductor substrate 1 with a front face 3', while FIG. 2B represents a second substrate 2 with a front face numbered 4'. Each of the front faces of the substrates 1 and 2 undergoes plasma treatment in accordance with FIGS. 2C and 2D. An insulating layer is deliberately not created on the surface of substrates 1 and 2 before they undergo the plasma treatment according to the invention. Furthermore, a native oxide layer resulting from exposure of the substrates to the ambient air may be present on the surface of these substrates.

Hence, the front face 3' of the first substrate 1 is subjected to treatment based on oxidizing gas, such as oxygen, water or nitrogen protoxide, in order to create an insulating layer 3 on the surface of substrate 1. If the plasma oxidizing treatment is carried out with oxygen, the pressure range is around 5 to 200 mT, the power range around 10 to 4000 W, the output around 10 to 1000 sccm, and this lasts for between 1 sec and 300 secs, in order to create the insulating layer 3 with a thickness varying between 2 nm and 15 nm. By way of example, the first substrate 1 is subjected to oxygen plasma at a pressure of 15 mT, a power of 1000 W and an output of 100 sccm for a duration of 30 secs, in order to produce an $SiO_2$ insulating layer 3 with a thickness of 8 nm.

Optionally, the front face 4' of the second substrate 2 may be subjected to plasma nitriding treatment; the nitriding gas may be chosen from among nitrogen, nitrogen dioxide, ammonium, nitrogen monoxide and nitric acid, with the general plasma nitriding conditions falling within a pressure range of 5 to 200 mT, a power range of 10 to 4000 W and an output range of 10 to 1000 sccm for a duration of between 1 and 300 secs, in order to create an insulating layer 4 with a thickness of between 2 nm and 15 nm. However, since this second plasma treatment is optional, the second substrate 2 may be brought into direct contact with the first substrate 1.

In the present case, the front face 4' of the second substrate 2 is subjected to nitrogen plasma at a pressure of 50 mT, a power of 1000 W and an output of 200 sccm for a duration of 45 secs, in order to produce a nitrided layer with a thickness of 5 nm.

Whichever of the two substrates 1 or 2 it is executed on, the plasma treatment performed not only enables a fine insulating layer to be created, but also the substrate surfaces treated to be activated, in order to achieve good quality bonding with an energy of some 500 $mJ/cm^2$ or more.

It is important to underline that whatever the plasma oxidizing or nitriding applied, the proportion of gas or gases used may be constant or variable during the treatment. Hence, it is possible to envisage that the proportion of oxidizing gas falls as the proportion of nitriding gas rises and, conversely, that the proportion of nitriding gas falls as the proportion of oxidizing gas rises.

In general terms, the plasma treatment parameters are adjusted, in order to control the thickness of the insulating layer 3, 4 formed by plasma on one and/or the other of the substrates and therefore the total thickness of the insulator buried in the final structure.

In all cases, plasma treatment leads to the formation of a single or multiple insulating layer, which may be made from silicon oxide ($SiO_2$), silicon nitride ($Si_3N_4$) or silicon oxynitride ($Si_xO_yN_z$) or may be of any other nature, depending on the plasmas used.

Thanks to this technique, a fine insulating layer is formed in the substrate surfaces, without any material whatsoever being provided, contrary to the depositing techniques that can likewise be used. In fact, the plasma treatment described in the present invention consists of a modification and/or consumption of the substrate surface treated, in order to oxidise, nitride or even oxynitride the surface of this substrate.

Preparation of the front faces 3' and 4' of the substrates prior to plasma treatment can be envisaged, such as, for example, cleaning, brushing or drying treatments. Hence, standard cleaning treatments can be applied to at least one of the two surfaces, such as, for example, RCA treatment that involves subjecting the substrates to a first solution made up of a mixture of ammonium hydroxide ($NH_4OH$), hydrogen peroxide ($H_2O_2$) and deionized water, followed by a second solution comprising a mixture of hydrochloric acid (HCl), hydrogen peroxide ($H_2O_2$) and deionized water.

The front faces 3' and 4' of the substrates 1 and 2 may be non-oxidized, non-nitrided, in other words, in general terms free from an insulator (oxide or nitride or oxynitride), or they may bring to their surface a native layer resulting from exposure of the substrates to the ambient air, such as, for example, native oxygen of around a few nm, more particularly with a thickness of under 3 nm.

Figure 2E:
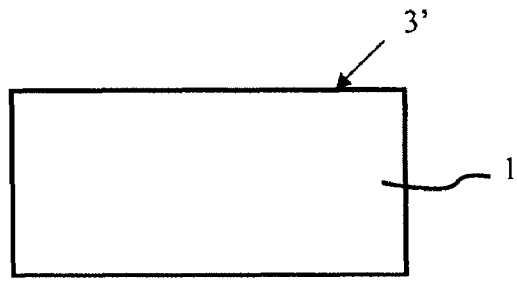
Figure 2E:
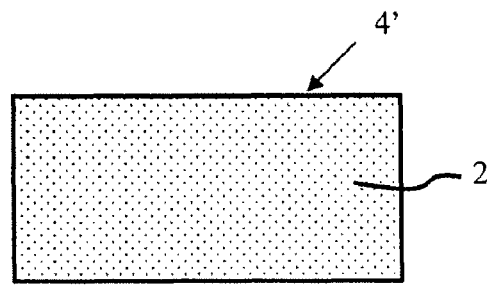
Figure 2E:
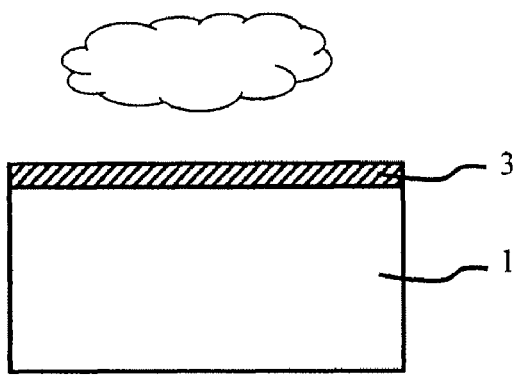
Figure 2E:
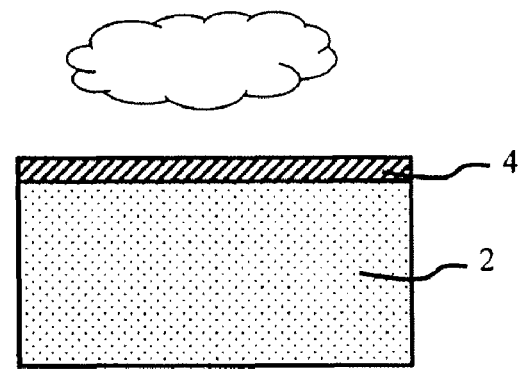
Figure 2E:
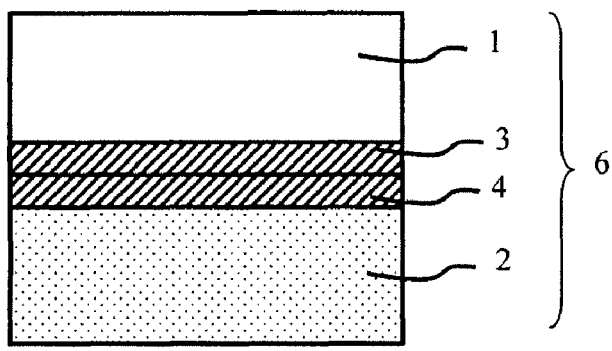

The two substrates 1 and 2 with their respective insulating layers 3 and 4 are then brought into close contact for assembly by molecular bonding to achieve the SeOI structure 6, as is shown in FIG. 2E. The structure 6 is made up successively of the substrate 2, the insulating layers 4 and 3 and the substrate 1.

According to the example described above, the first insulating layer 3 in $SiO_2$ measuring 8 nm is brought into contact with the second nitrided insulating layer 4, which is 5 nm thick, so that the final structure 6 has an insulating layer with a final thickness of 13 nm.

Two additional embodiments are now to be described in relation to FIGS. 3A to 3F and 4A to 4F. The same elements have the same numerical references and will not be described again.

Figure 3A:
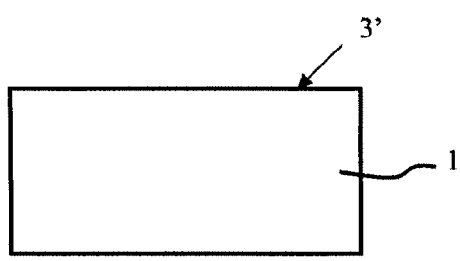
FIGS. 3A to 3F are diagrams representing successive stages of a second embodiment of the inventive procedure.
Figure 3B:
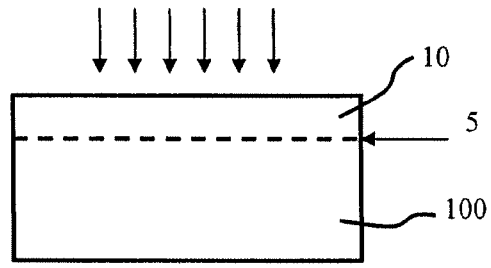
Figure 3C:
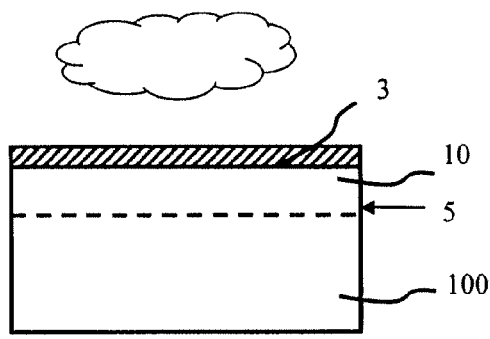
Figure 3D:
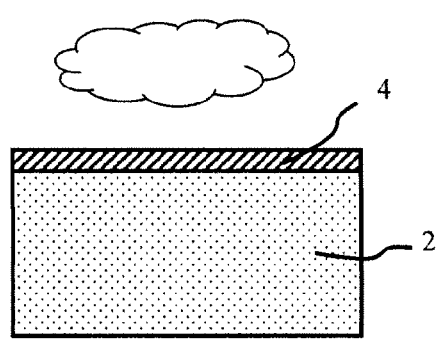
Figure 3E:
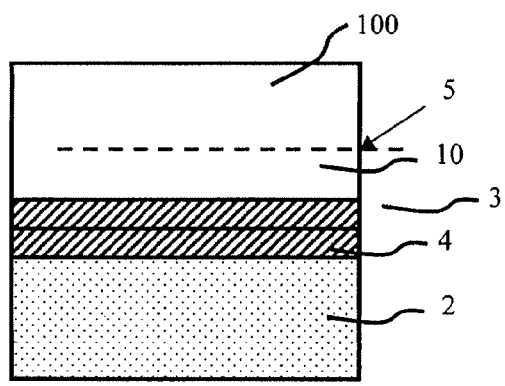
Figure 3F:
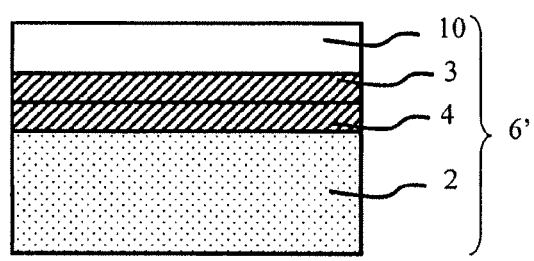

FIGS. 3A and 3F illustrate an embodiment of the invention that uses the Smart Cut™ procedure. For a more detailed description of this type of implantation procedure, please consult the publication "Silicon on insulator technology: materials to VLSI", $2^{nd}$ edition, Jean-Pierre COLINGE, pp. 50-51.

FIG. 3A shows a first substrate 1 with its front face 3', whereas FIG. 3B shows the same first substrate 1 undergoing an atomic or ionic species implantation stage. The purpose of this implantation is to create a weakened zone 5 within the first substrate 1, which defines a thin, so-called active layer 10 in a section referred to as 100 of the first substrate 1. It is likewise possible to carry out a co-implantation of atomic and/or ionic species with, for example, the implantation of hydrogen and helium species.

As illustrated in FIG. 3C, the first substrate 1 is subjected to plasma nitriding treatment. For example, ammonium plasma is achieved at a pressure 50 mT, a power of 500 W and an output of 200 sccm for a duration of 45 secs, in order to create a nitrided insulating layer 3 with a thickness of 4 nm. In relation to the second substrate 2, it undergoes plasma oxidizing treatment according to the methods described herein. Hence, for example, oxygen plasma is applied at a pressure of 50 mT, a power of 500 W and an output of 200 sccm for a duration of 45 secs, In order to create an insulating layer 4 in $SiO_2$ with a thickness of 6 nm.

In general terms, plasma treatments are carried out at low temperatures, in other words, at a temperature below 200° C., more precisely, under 100° C., or even at ambient temperature. Preferably, the plasma treatment is performed on an RIE type of plasma equipment (i.e., Reactive Ion Etching) at a temperature below 50° C.

Optionally, a thermal treatment may be applied to the insulating layers 3, 4 formed in the surface of the substrates 1 and/or 2 prior to bonding following the treatment according to the invention. This thermal treatment involves subjecting the substrates to a temperature of between 50° C. and 350° C. for between 30 mins and 5 hrs, in order to improve the electrical and/or physical properties of the insulating layer 3, 4 formed on one or the other of the substrates 1, 2. This is then followed by the direct wafer bonding of the second substrate 2 and the first substrate 1, bringing the insulating layer 3 of the first substrate 1 into close contact with the insulating layer 4 of the second substrate 2. This stage is shown in FIG. 3E.

Prior to the plasma treatment stages of substrates 1 and 2 shown in FIGS. 3C and 3D, it is possible, as an option, to carry out a cleaning stage of the substrate surfaces to be treated, as described previously. Finally, as shown in FIG. 3F, the first substrate 1 is thinned down by detaching a section 100 of said first substrate 1, so as to obtain a composite SeOI structure, referred to as 6', made up successively of the second substrate 2, the stack of insulating layers 4 and 3 and a thin active layer 10. The section 100 is detached along the weakened zone 5, through the application of mechanical, chemical and/or thermal forces, such as by thermal treatment between 200° C. and 500° C., for example.

The final structure 6' thereby comprises an alternation of oxide and nitride layers not limited to this exact stacking. In fact, it is possible to envisage all possible alternations depending on the nature and number of the insulating layers present. For different applications, it is in fact possible to apply at least two plasma treatments in succession on one or both substrates. In general terms, the final insulating layer of the structure 6' formed by stacking the insulating layers obtained by the different plasma treatments has a thickness of between 2 and 25 nm.

Figure 5:
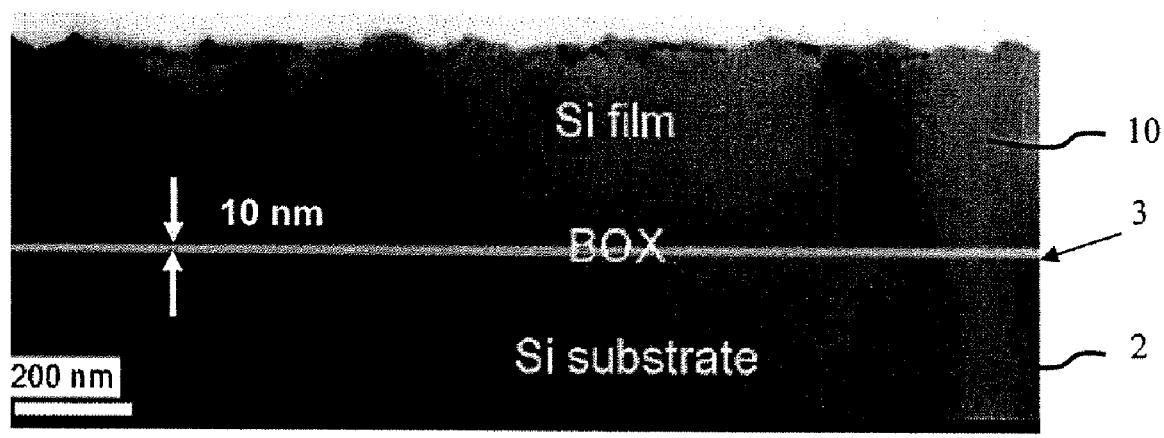
FIG. 5 is a sectional view by transmission electron microscopy of an UTBOX SOI substrate with a buried insulating layer 10 nm thick, achieved by the second embodiment of the inventive procedure.

According to the example described previously, the first nitrided insulating layer 3 measuring 4 nm is brought into contact with the second insulating layer 4 of $SiO_2$, which is 6 nm thick, so that the final structure 6 has an insulating layer with a final thickness of 10 nm. FIG. 5 shows a sectional view by transmission electron microscopy of this sort of final structure, in this case an UTBOX SOI substrate with a buried insulator 10 nm thick, obtained from the second embodiment according to the invention.

Optionally, the structure 6' undergoes a finishing treatment involving at least one thinning and/or smoothing stage chosen from among dry or wet etching, oxidation/deoxidation, polishing and thermal treatment (such as Rapid Thermal Anneal (RTA) or long annealing in a neutral or reducing atmosphere).

In the third embodiment shown in FIGS. 4A to 4F, the weakened zone 5' is made up of a porous layer obtained, for example, by a procedure known to the person skilled in the art as ELTRAN™ process. Hence, FIG. 3B shows the first substrate 1 including this porous layer 5' defining a thin, so-called active layer 10 of a section 100 of the first substrate 1. As shown in FIG. 3C, the first substrate 1 is subjected to plasma treatment in an oxidizing atmosphere, in order to create an insulating layer 3 on the front face 3' of the first substrate 1.

Figure 4A:
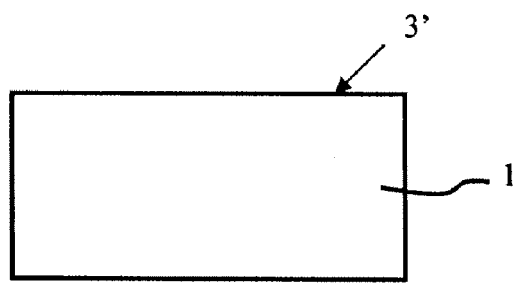
FIGS. 4A to 4F are diagrams representing successive stages of a third embodiment of the inventive procedure.
Figure 4B:
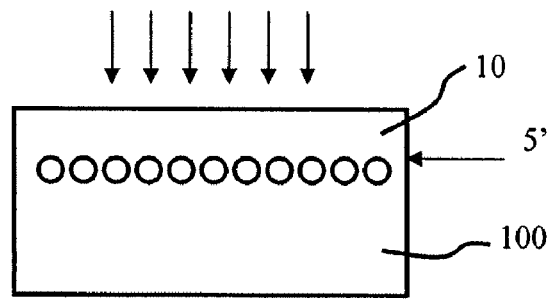
Figure 4C:
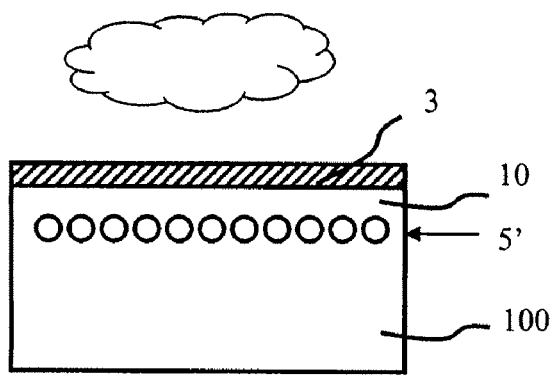
Figure 4D:
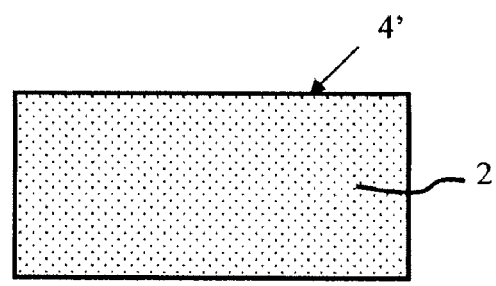
Figure 4E:
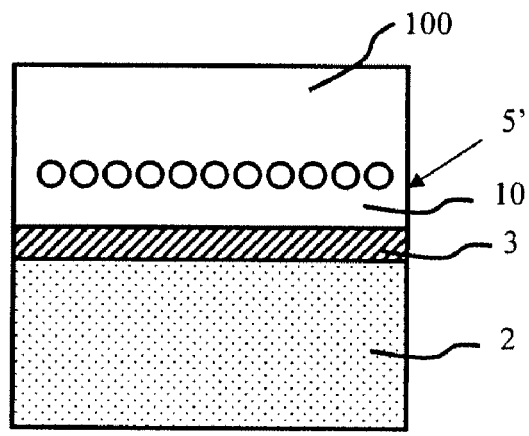

Prior to the plasma treatment stage of the first substrate 1 and before the latter is assembled with the second substrate 2, as shown in FIG. 4E, it is possible for an optional cleaning stage of surfaces 3' and 4' to be carried out. Bonding of the first substrate 1 and of the second substrate 2 is carried out by bringing the insulating layer 3 into close contact with the front face 4' of the substrate 2. A thermal treatment may be applied in order to reinforce the bonding interface. A thermal budget of between 200° C. and 1100° C. is thereby applied for between 30 mins and 20 hours.

Figure 4F:
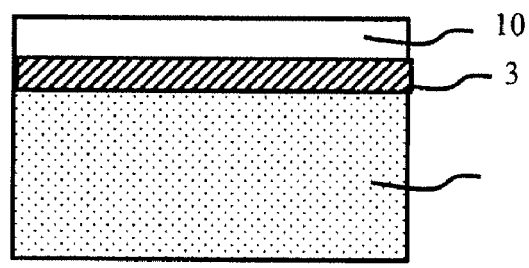

Elimination of the section 100 of the first substrate 1 is carried out by applying mechanical forces, by mechanical-chemical polishing, by providing thermal energy and/or by chemical attack, through the application of a liquid, such as a pressurized water jet at the level of the weakened zone 5', or else by grinding or etching, as shown in FIG. 4F.

The final structure obtained as a result of this third embodiment is referred to as 6" and differs from the aforementioned substrate 6' in that the bonding interface includes a single insulating layer: insulating layer 3.

Finally, although this is not shown in the figures, it will be noted that other embodiments of the inventive procedure may be used, notably by applying not a single oxidizing and/or nitriding plasma to the first substrate 1, but a single plasma oxidizing and/or nitriding treatment to the second substrate 2 prior to bonding with the first substrate 1, or else by combining different plasma treatments on one or both substrates to be assembled. It can therefore be envisaged that at least two plasma treatments are applied in succession to one or both substrates.

The substrates 1 and 2 are semiconductor materials and can be chosen from between crystalline-oriented silicon (100), or (110), or (111), polycrystalline silicon, silicon carbide, germanium and gallium arsenide. The second substrate 2 may likewise be made from sapphire, quartz, translucent fused quartz or also glass.

Thanks to the plasma treatments applied to the first substrate 1 and/or the second substrate 2, an insulating layer and an activated surface are formed in a single stage, resulting in a good quality bond, while anticipating the quality of the substrates treated and limiting the thermal budgets applied. The sharp reduction in the thermal budget associated with the suppression of the insulator deposition or thermal treatment stage (e.g. thermal oxidation of the silicon) forming the insulator makes it possible to limit the number of defects generated at temperatures of over 600° C., so that dislocation slip lines or else oxide precipitates may appear within the substrates treated. This also makes it possible for substrates to be recycled. In fact, it is possible to reuse section 100 of the first substrate 1 for at least a second active layer 10 transfer onto a new second substrate 2.

What is claimed is:

1. A method of producing a semiconductor structure having a buried insulating layer of a thickness of between 2 and 25 nm, which comprises:
    forming at least one insulating layer on a surface of a first or second substrate, or on both substrates, with the surface(s) receiving the insulating layer initially being free of any insulator other than the presence of a native oxide layer resulting from exposure of the substrate(s) to ambient conditions, and with the insulating layer being formed by plasma activation based on an oxidizing or nitriding gas;
    assembling the first and second substrates together; and
    thinning the first substrate in order to obtain the semiconductor structure.

2. The method according to claim 1, wherein the plasma activation is based on an oxidizing gas comprising oxygen, water or nitrogen protoxide and is conducted to create an insulating layer having a thickness of between 2 nm and 15 nm.

3. The method according to claim 1, wherein the plasma activation is based on a nitriding gas comprising nitrogen, nitrogen dioxide, nitrogen monoxide, ammonia, or nitric acid and is conducted to create an insulating layer having a thickness of between 2 nm and 15 nm.

4. The method according to claim 1, characterized in that the first substrate and the second substrate are made of silicon and in that the insulating layer that is formed is silicon oxide ($SiO_2$), silicon nitride ($Si_3N_4$) or silicon oxynitride ($Si_xO_yN_z$).

5. The method according to claim 1, wherein the insulating layer of the semiconductor structure is an alternation of oxide and nitride layers.

6. The method according to claim 1, wherein the plasma activation applies the nitriding gas at a power of between 10 W and 4000 W.

7. The method according to claim 1, wherein the nitriding gas is applied at a pressure of between 5 mT and 200 mT.

8. The method according to claim 1, wherein plasma activation provides an output of the nitriding gas of between 10 sccm and 1000 sccm.

9. The method according to claim 1, wherein the plasma activation is applied at an exposure time of between 1 second and 300 seconds.

10. The method according to claim 1, wherein at least two plasma activations are applied in succession to either or both of the first and second substrates.

11. The method according to claim 1, wherein the plasma activation is applied at temperatures below 200° C.

12. The method according to claim 1, wherein the plasma activation is applied at ambient temperature.

13. The method according to claim 1, wherein the first substrate or second substrate is crystalline-oriented silicon (1,0,0), (1,1,0), or (1,1,1).

14. The method according to claim 1, which further comprises, prior to assembling, subjecting the first or second substrate that includes the insulating layer to a thermal treatment to improve the electrical or physical properties of the insulating layer.

15. The method according to claim 1, which further comprises, prior to the assembling of the substrates, providing a weakened zone within the first substrate to define an active layer of a section of the first substrate, so that the thinning of the first substrate is realized by detaching the active layer along the weakened zone.

16. The method according to claim 15, wherein the weakened zone is formed by implantation or co-implantation of atomic or ionic species into the first substrate.

17. The method according to claim 15, wherein the remaining section of the first substrate following detachment of the active layer is used as a first substrate for at least two further detachments of active layers.

18. The method according to claim 15, wherein the plasma activation is based on an oxidizing gas comprising oxygen, water or nitrogen protoxide and is conducted to create an insulating layer having a thickness of between 2 nm and 15 nm.

19. The method according to claim 15, characterized in that the first substrate and the second substrate are made of silicon and in that the insulating layer that is formed is silicon oxide ($SiO_2$), silicon nitride ($Si_3N_4$) or silicon oxynitride ($Si_xO_yN_z$).

20. The method according to claim 15, which further comprises, prior to assembling, subjecting the first or second substrate that includes the insulating layer to a thermal treatment to improve the electrical or physical properties of the insulating layer, wherein the thermal treatment comprises subjecting the substrate(s) to a temperature of between 50° C. and 350° C. for between 30 mins and 5 hrs.

* * * * *

UNITED STATES PATENT AND TRADEMARK OFFICE
CERTIFICATE OF CORRECTION

PATENT NO. : 7,892,951 B2
APPLICATION NO. : 12/237000
DATED : February 22, 2011
INVENTOR(S) : Landru et al.

It is certified that error appears in the above-identified patent and that said Letters Patent is hereby corrected as shown below:

Title Page:
Item (56) References Cited, FOREIGN PATENT DOCUMENTS, after "EP 1 659 623 B1" change "4/2008" to -- 5/2006 --.

Item (56) References Cited, OTHER PUBLICATIONS:
   French Search Report, change "0707534" to -- 0707535 --;
   R. H. Esser et al., change "0/" to -- of --; and
   Sheri N. Farrens, change "Sheri" to -- Shari --.

Signed and Sealed this
Nineteenth Day of April, 2011

David J. Kappos
*Director of the United States Patent and Trademark Office*